US006960255B2

(12) United States Patent
Aizenberg

(10) Patent No.: US 6,960,255 B2
(45) Date of Patent: Nov. 1, 2005

(54) FRAMEWORK ASSISTED CRYSTAL GROWTH

(75) Inventor: Joanna Aizenberg, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 141 days.

(21) Appl. No.: 10/319,038

(22) Filed: Dec. 13, 2002

(65) Prior Publication Data

US 2004/0112279 A1 Jun. 17, 2004

(51) Int. Cl.[7] .................................................. S30B 19/10

(52) U.S. Cl. .................... 117/54; 117/84; 252/188.3 R; 423/430

(58) Field of Search ................................ 117/54, 2, 84; 423/430, 432; 252/188.3 R

(56) References Cited

U.S. PATENT DOCUMENTS

| | | | |
|---|---|---|---|
| 4,237,147 A | 12/1980 | Merten et al. | 426/590 |
| 5,651,818 A | 7/1997 | Milstein et al. | 117/54 |
| 5,688,318 A | 11/1997 | Milstein et al. | 117/1 |
| 6,261,469 B1 | 7/2001 | Zakhidov et al. | 216/56 |
| 2002/0059897 A1 | 5/2002 | John et al. | 117/84 |

FOREIGN PATENT DOCUMENTS

| | | | |
|---|---|---|---|
| WO | WO 01/86038 | 11/2001 | C30B/29/60 |

OTHER PUBLICATIONS

"Factors Involved in the Formation of Amorphous and Crystalline Calcium Carbonate: A Study of an Ascidian Skeleton," Aizenberg, J., Lambert, G., Weiner, S, and Addadi, L., *Journal of the American Chemical Society*, vol. 124, No. 1, pp. 32–39, 2002.

"Oriented Growth of Calcite Controlled by Self–Assembled Monolayers of Functionalized Alkanethiols Supported on Gold and Silver," Aizenberg, J., Black, A.J., and Whitesides, G.M., *Journal of the American Chemical Society*, vol. 121, No. 18, pp. 4500–4509, 1999.

"Amorphous Calcium Carbonate Transforms into Calcite during Sea Urchin Larval Spicule Growth," Beniash, E., Aizenberg, J., Addadi, L., and Weiner, S., *Proc. R. Soc. Lond.* B, vol. 264 (1997), pp. 461–465, 1997.

"The Mechanisms of Crystallization and Transformation of Calcium Carbonates," Sawada, K., *Pure & Appl. Chem.*, vol. 69, No. 5, pp. 921–928, 1997.

Joanna Aizenberg et al, "Calcite microlenses as part of the photoreceptor system in brittlestars", Natrue vol. 412 (Aug. 23, 2001) pp. 819–822.

Joanna Aizenberg, et al, "Controlling local disorder in self–assembled monolayers by patterning the topography of their metallic supports", *Nature, MacMillan Journals Ltd. London*, GB vol. 394, Aug. 27, 1998, pp. 868–871.

Joanna Aizenberg, "Patterned crystallization of calcite in vivo and in vitro", *Journal of Crystal Growth, North–Holland Publishing Co., Amsterdam, NL*, vol. 211, No. 1–4, (2000), pp. 143–148.

Joanna Aizenberg, et al, "Stabilization of Amorphous Calcium Carbonate by Specialized Macromolecules in Biological and Synthetic Precipitates", *Advanced Materials, VCH Verlagsgesellschaft, Weinheim, DE*, vol. 8, No. 3, (1996), pp. 222–226.

(Continued)

*Primary Examiner*—Felisa Hiteshew
(74) *Attorney, Agent, or Firm*—John F McCabe

(57) ABSTRACT

A method for growing a crystal includes steps of providing a 3D framework with an collection of solid structures and flowing a liquid starting material around and between individual ones of the solid structures of the 3D framework. The method also includes a step of growing a single crystal through the collection of solid structures by adjusting a property of the liquid starting material.

20 Claims, 8 Drawing Sheets

OTHER PUBLICATIONS

Joanna Aizenberg, et al, "Patterned Colloidal Deposition Controlled by Electrostatic and Capillary Forces", *Physical Review Letters, The American Physical Society, NY, NY*, vol. 84, No. 13, Mar. 27, 2000, pp. 2997–3000.

Joanna Aizenberg, et al, "Factors Involved in the Formation of Amorphous and Crystalline Calcium Carbonate: A Study of an Ascidian Skeleton", *Journal of the American Chemical Society*, vol. 124, No. 1, 2002, p. 32–39.

European Search Report for Application No. 03255048.5–1215 (Mar. 16, 2004), 4 pages.

FRAMEWORK ASSISTED CRYSTAL GROWTH

BACKGROUND

1. Field of the Invention

The invention relates to crystalline structures and the fabrication of such structures.

2. Discussion of the Related Art

Polycrystalline films form active channels of many organic field effect transistors (OFETs). In such polycrystalline films, individual crystalline domains are separated by grain boundaries. Unfortunately, the grain boundaries tend to lower conductivities of the films. For this reason, it would be useful to produce single crystal films of the materials used in such electronic devices.

Artificial crystalline structures are also used as optical gratings and photonic bandgap devices. The artificial crystalline structures have mesoscopic-scale regular lattices in which lattice lengths are in the range of about 100 nanometers (nm) and about 5 microns ($\mu$). Presently, sedimentation and lithographic methods are able to produce such artificial crystalline structures. Nevertheless, these processes are complex and typically require special materials. For these reasons, it is desirable to have other direct processes for fabricating artificial crystalline structures.

BRIEF SUMMARY

Various embodiments relate to bottom-up methods for growing a single crystal in an assisting three-dimensional (3D) framework. The framework is referred to as a 3D framework, because it includes a collection of solid structures whose surfaces are spread through a 3D region. The solid structures assist crystal growth by collecting byproduct materials produced during the growth. The accumulation of byproduct materials could otherwise interfere with growth of a single crystal. The collection of the solid structures can also assist the growth by stabilizing a starting material for the growth against spontaneous crystal nucleation.

In a first aspect, the invention features a method for growing a crystal. The method includes providing a 3D framework that includes a collection of solid structures and flowing a liquid starting material around and between individual ones of the solid structures. The method also includes growing a single crystal through the collection of solid structures by adjusting a property of the liquid starting material.

In a second aspect, the invention features an apparatus having a layer that is formed of a single crystal. The layer includes a collection of holes in the layer. The collection of holes forms a pattern with a regular lattice symmetry. The holes may be substantially identical.

DETAILED DESCRIPTION OF ILLUSTRATIVE EMBODIMENTS

Figure 1:
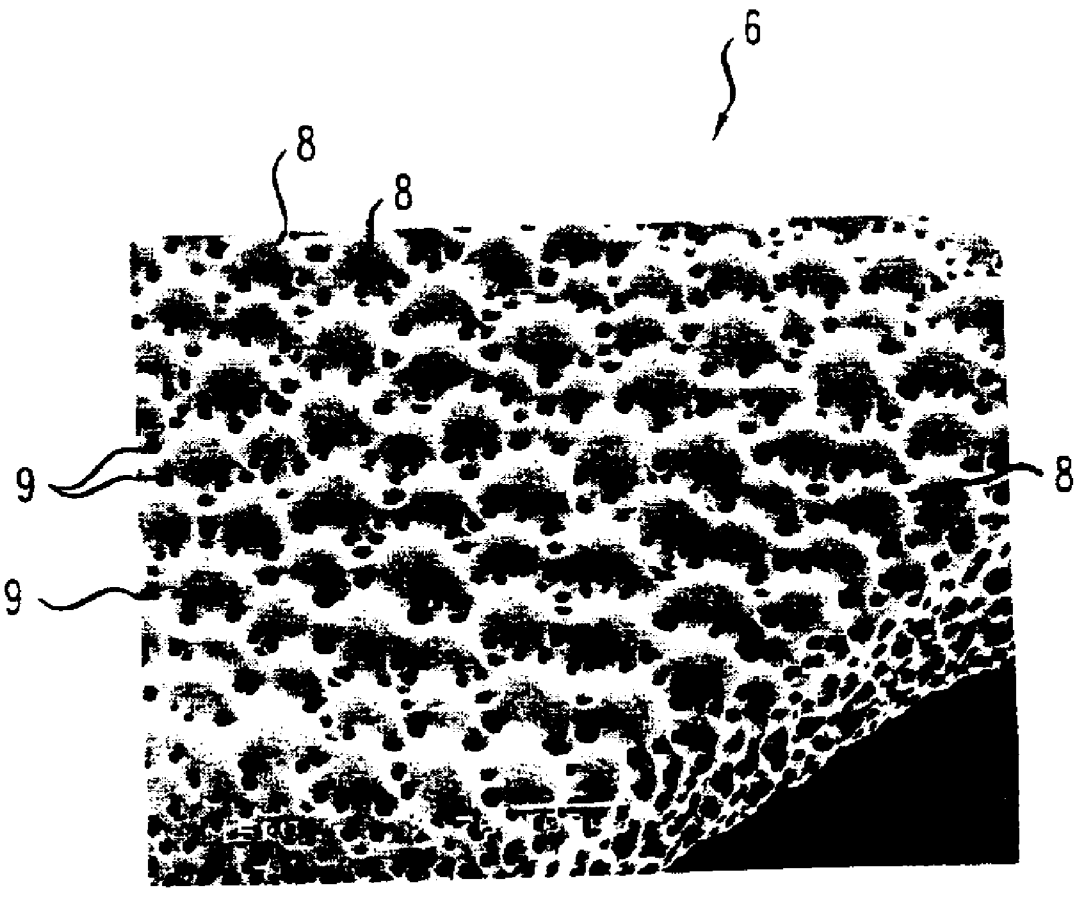
FIG. 1 is an oblique view of a portion of the crystalline skeleton of a brittle star.

Many organisms have crystalline skeletal structures. FIG. 1 shows one such structure 6 found in an echinoderm species known as a brittle star. The structure 6 is a single calcite crystal that includes a collection of lenses 8 and holes 9. While the lenses 8 and holes 9 form irregular patterns, the lenses 8 are oriented along the crystal's c-axis. This orientation prevents double image formation. Average separations between adjacent lenses 8 are about 1–10 microns. Since the structure 6 is found in a living organism, the structure 6 appears to be produced by a bottom-up growth process that occurs inside the brittle star's biological matrix.

Various embodiments provide bottom-up methods for growing a single crystal from various materials. Exemplary materials may include minerals, zeolites, and organic semiconductors. The single crystal is pierced by a micro-pattern of holes that go entirely through the crystal. Herein, in a micro-pattern, centers of adjacent holes are separated by 10 nm to 50$\mu$ and are preferably separated by about 1.0$\mu$–20$\mu$. The various bottom-up methods grow a crystal inside an assisting 3D framework.

Figure 2:
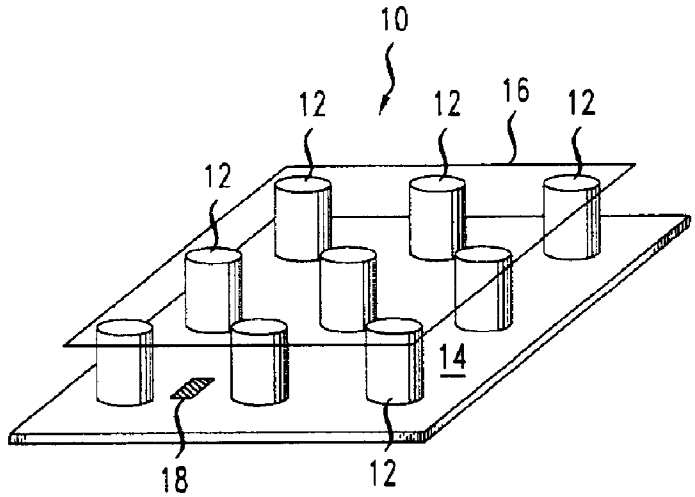
FIG. 2 is an oblique view of a 3D framework for assisted growth of a crystal.

FIG. 2 shows an exemplary 3D framework 10 for assisting growth of a crystal. The 3D framework 10 includes a plurality of substantially identical solid structures 12. The spatially distributed set of surfaces of the solid structures 12 stabilize a metastable phase for growing a crystal and also collect byproduct materials generated during the crystal growth. The structures 12 are laterally distributed along a substrate 14. The 3D framework 10 includes a second substrate 16 that encloses the region in which crystal growth will occur.

Center-to-center separations between adjacent pairs of the structures 12 are not larger than the average diameter of single crystals of the same material that would be produced by similar growth conditions without the 3D framework 10. In particular, the center-to-center separations are less than average grain diameters in polycrystalline materials that result when the same materials grow under similar conditions except without the 3D framework 10.

In the 3D framework 10, the substrate 14 includes a site 18 that has been specifically engineered to nucleate crystallization. The structure of the engineered nucleation site 18 aids crystal nucleate with a specific lattice orientation. The remainder of the surfaces of the substrates 10, 16 and the structures 12 are treated to inhibit crystal nucleation. Thus, the 3D framework 10 includes a unique preselected site at which the nucleation of crystallization is favored.

Figure 3:
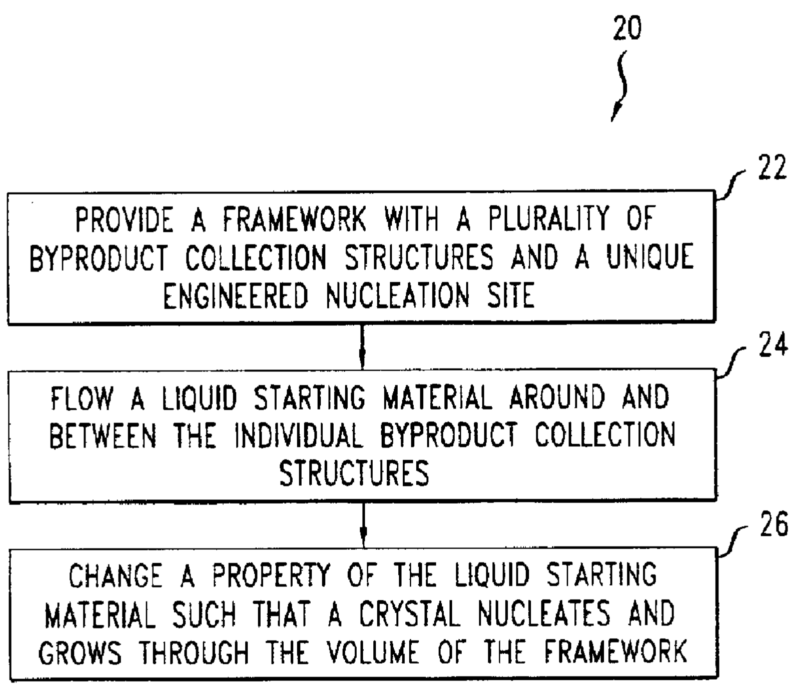
FIG. 3 is flow chart for a method of growing a crystal within an assisting 3D framework.

FIG. 3 illustrates a method 20 for growing a single crystal inside a 3D framework, e.g., the 3D framework 10 of FIG. 2. The method 20 involves providing the 3D framework to assist crystal growth (step 22). The 3D framework includes a collection of byproduct collection structures distributed in a 3D volume, e.g., structures 12 of FIG. 2, and a unique engineered nucleation site, e.g., site 18 of FIG. 2. The method 20 involves flowing a liquid starting material into the 3D framework such that the liquid goes around and between the individual byproduct collection structures (step 24). Exemplary, liquid starting materials include solutions of material for growing a crystal. The flowing step is performed under conditions that inhibit crystal nucleation.

The method 20 also involves changing a property of the liquid starting material to produce a metastable phase, e.g., an amorphous phase, from which a crystal will grow through the volume of the 3D framework (step 26). The metastable phase is produced either by diffusing a reactive gas into the liquid starting material or by changing the temperature of the liquid starting material. The metastable phase is stabililized by the collection of byproduct collection structures, surface treatments, and/or additives so that nucleation does occur spontaneously or randomly. Instead, the changed property causes nucleation at the engineered nucleation site. The single nucleated crystal grows into the 3D framework so that some of the individual byproduct collection structures are enclosed in the final crystal. Since nucleation is much more probable at the engineered nucleation site than elsewhere in the 3D framework, the crystal nucleated at the engineered site grows through the 3D framework before a second nucleation occurs elsewhere.

In some embodiments, the method 20 also includes removing the 3D framework 10 from the final crystal. An exemplary removal step involves washing the structure formed from the crystallized material and the 3D framework with a solution to dissolve the byproduct collection structures. Such a removal produces a crystal that is micropatterned with holes formed by the previously present byproduct collection structures.

The transition from a metastable state of the liquid starting material to a crystalline state generates byproduct material as the crystal grows. Some byproduct material must result from the transition due to the different compositions and/or densities of the liquid starting material and the final crystal. During the crystal growth, the byproduct collection structures function as sumps for collecting the growth-generated byproduct materials. After the growth, layers of byproduct material surround the individual byproduct collection structures. This sump action enables growth to proceed without accumulation of byproduct material at the growth surface of the crystal. Without the byproduct collection structures, growth would either stop or produce a polycrystalline material as schematically illustrated by FIGS. 4 and 5.

Figure 4:
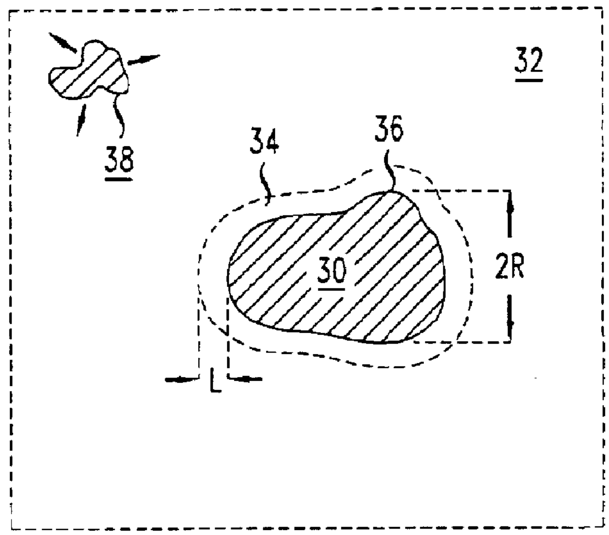
FIG. 4 is a top view of a crystal growing from a liquid starting material.
Figure 5:
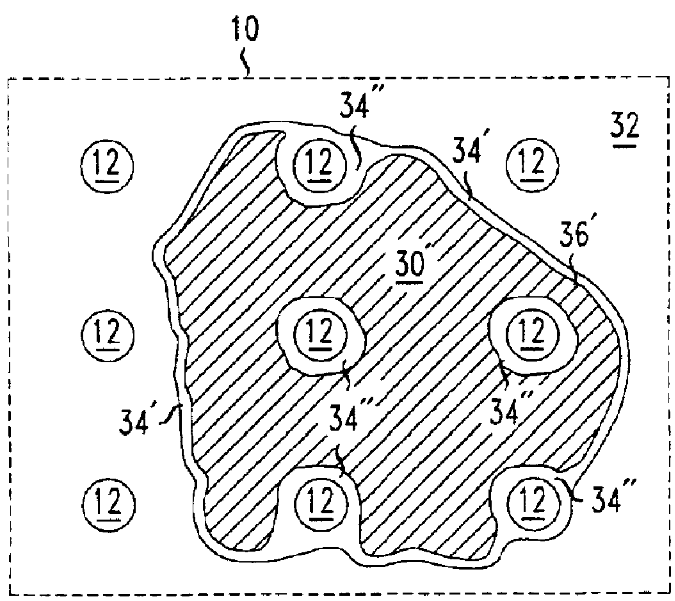
FIG. 5 is a top view of a crystal growing from the liquid starting material inside an assisting 3D framework.

FIG. 4 illustrates growth of a crystal 30 without an assisting 3D framework. The crystal 30 grows from a metastable amorphous phase of a liquid starting material 32, which has a different composition than the final crystal. Due to this difference in compositions, the growing crystal 30 must produce and displace a layer 34 of growth-byproduct material in front of its growth surface 36. The byproduct material has a composition that is different from that of the crystal and that of the metastable phase of the liquid starting material 32. For a calcite crystal growing from an amorphous phase of calcium carbonate, the byproduct material is deficient in the chemical components that crystallize with respect to the amorphous phase. The layer 34 of byproduct material occupies a volume that is approximately equal to the area of the crystal's growth surface 36 times the average thickness, L, of the layer 34 of byproduct material.

Since the layer 34 results from volume growth of the crystal 30, the layer's volume is proportional to the crystal's volume. Since the crystal's area and volume are proportional to the respective square and cube of the average crystal radius, R, the layer thickness L grows approximately linearly with R. For these reasons, the layer 34 of byproduct material becomes thicker as the crystal grows. After a certain growth time, the layer 34 of byproduct material becomes so thick that it significantly impedes the diffusion of material from the liquid starting material 32 to the growth surface 36. At this time, growth of the crystal 30 slows and stops.

Nevertheless, the stopped growth of the crystal 30 does not stop other crystals 38 from growing in other portions of the amorphous phase 30. Such crystals 38 will continue to spontaneously nucleate and grow. For this reason, growth without an assisting 3D framework often produces a multi-crystalline final material.

FIG. 5 illustrates how a crystal 30' grows inside the assisting 3D framework 10 of FIG. 2. In the 3D framework 10, layers 34" of liquid byproduct material collect adjacent to the structures 12 that the crystal's growth surface 36' encounters during the growth. In particular, the structures 12 attract liquid byproduct material out of the layer 34' at the growth surface 36', because the structures 12 have surfaces that attract the byproduct material. For example, the structures 12 are wettable by the byproduct material. As a result, at the growth surface 36', the layer 34' of liquid byproduct material remains thin as the growth progresses. Thus, accumulation of such byproduct material does not occur at the growth surface 36' itself and thus, does not stop the crystal's growth. For this reason, the growth produces a crystal 30' with linear dimensions unobtainable for crystal 30 of FIG. 4 in which liquid byproduct material is not removed from the growth surface 36.

For crystal growth from an aqueous starting solution, exemplary byproduct collection structures 12 have hydrophilic surfaces. The hydrophilic surfaces cause the aqueous solution of byproduct material to wet the structures 12 during the growth. The wetting draws the byproduct material from the layer 34' at the growth surface 36' and produces a layer 34" of such material around individual ones of the hydrophilic structures 12.

To deplete byproduct material from the layer 34' so that a single crystal grows rather than a polycrystalline material, the structures 12 should be closely spaced and have surfaces that are distributed throughout the 3D volume of the amorphous liquid starting material 32. If the structures 12 are not sufficiently close together, an accumulation of byproduct material in the layer 34' will either stop the growth or result in polycrystalline growth.

In some embodiments, the byproduct collection structures 12 also release lattice-strain produced during crystal growth. The structures 12 release such strain by collecting lattice-defects along their surfaces. Without the byproduct collection structures 12, the accumulation of such growth-generated lattice-strain could fracture the growing crystal 30' thereby causing the formation of a polycrystalline material.

The structures 12 produce smooth holes that pierce through the thickness of the final crystal. The smooth holes have rounded edges at interfaces with surfaces rather than the sharp edges and corners characteristic of holes produced by etching. The rounded edges result from the hole-creation process, which involves the accumulation of a liquid byproduct material about the structures 12.

Some 3D frameworks produce a pattern of holes with the symmetry of a regular one-dimensional (1D), two dimensional (2D), or three dimensional (3D) lattice. The periodicity produces a micro-pattern in the crystal 30' that is associated with a regular mesoscopic-scale lattice. This regular lattice symmetry is useful in producing optical gratings and photonic bandgap structures via the above-described bottom-up crystal growth method.

Figure 6:
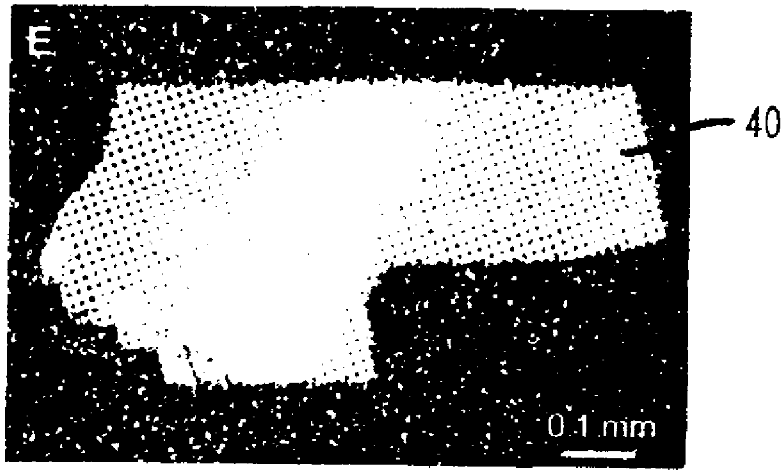
FIG. 6 is a top view of a calcite layer that is a single crystal.
Figure 7:
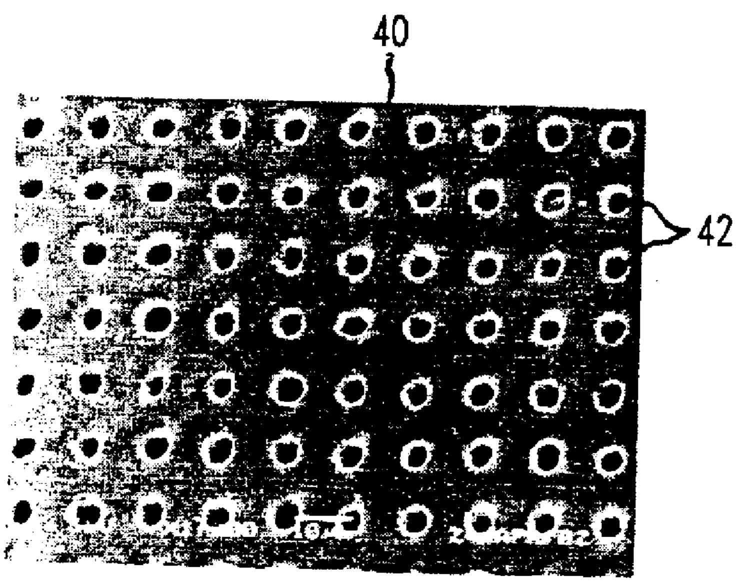
FIG. 7 is a magnified oblique view that shows a cubic array of holes piercing the entire thickness of the calcite layer of FIG. 6.
Figure 8:
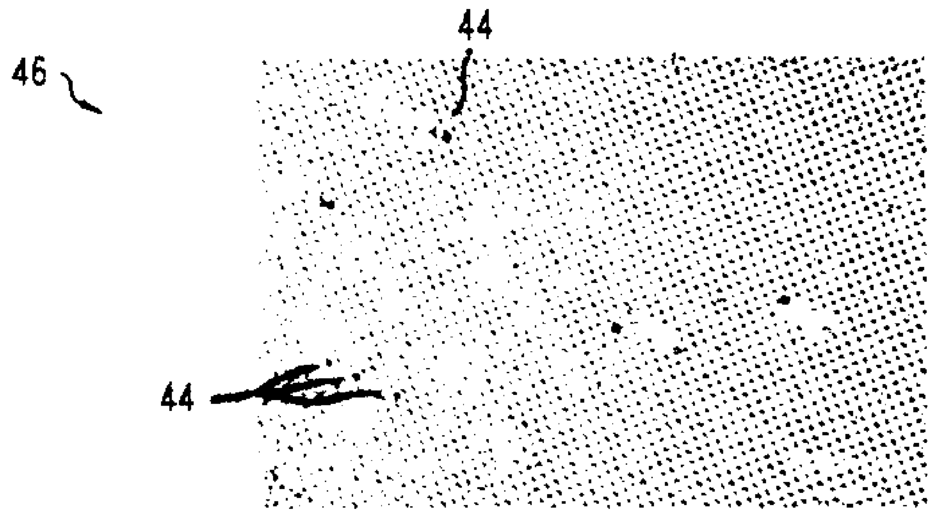
FIG. 8 is a top view of the 3D framework that assisted the grow of the calcite layer shown in FIGS. 6–7.

FIGS. 6–7 show a planar calcite crystal that was grown in an assisting 3D framework by a particular embodiment of the method 20 of FIG. 3. The calcite crystal 40 has a length of about 0.8 millimeters (mm) and a width of about 0.25 mm to 0.35 mm. The crystal 40 includes a micro-pattern of holes 42 that forms a regular lattice with a 2D simple cubic periodicity. Due to their nor-etching origin, the holes 42 have rounded edges where they meet outer surfaces of the crystal 40. In the micro-pattern, nearest neighbor holes have center-to-center separations of less than 50$\mu$, e.g., about 10$\mu$ or less. The micro-pattern of the holes 42 results from the volume distribution of post-shaped byproduct collection structures 44 in the original 3D framework 46 used to grow the crystal 40 (see FIG. 8). In the 3D framework 46, the byproduct collection structures 44 are separated by about 10$\mu$.

Figure 9:
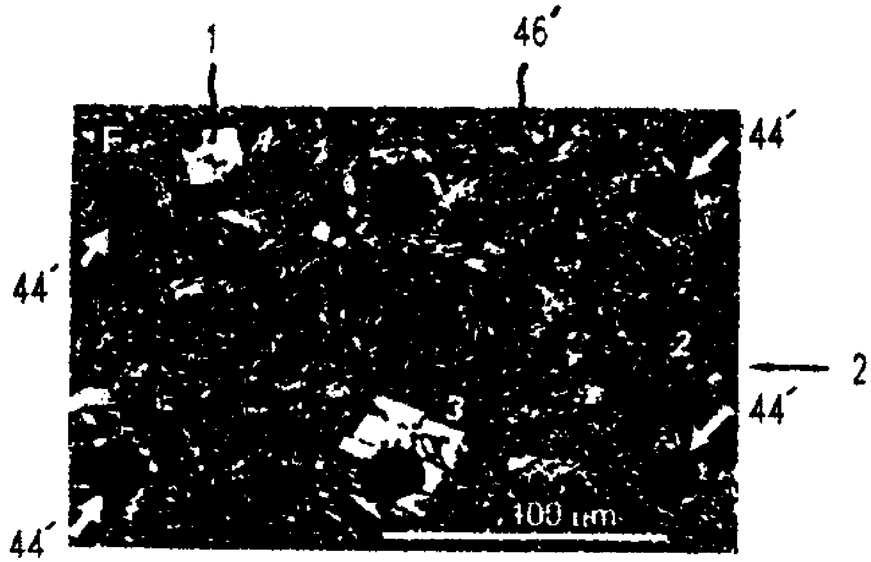
FIG. 9 is a top view of a calcite material grown with a 3D framework whose byproduct collection structures are more separated than in the framework of FIG. 8.

FIG. 9 shows calcite crystals 1, 2, 3 that were grown under conditions similar to those that grew the crystal 40 of FIGS. 6–7 with the exception of the 3D framework. In particular, the crystals 1,2, 3, were grown in a 3D framework 46' in which the density of byproduct collection structures 44' is much lower than in the 3D framework 46 of FIG. 8. The 3D framework 46' has post-shaped byproduct collection structures 44' with nearest neighbor separations of about 100 microns. The larger separations between the byproduct collection structures 44' impedes the sump action that removes liquid byproduct material at the growing surface of the crystals 1, 2, 3. For this reason, the crystals 1, 2, 3 fractured during their growth to produce polycrystalline final materials.

The detailed process for growing the crystal 40 of FIGS. 6–7 includes steps of fabricating the assisting 3D framework 46, flowing a liquid starting material into the 3D framework 46, causing a crystal to grow from the liquid starting material through the framework, and removing the 3D framework 46 from the final crystal.

The step of fabricating the 3D framework produces a substantially enclosed structure with an array of post-like byproduct collection structures 44, and a gas-permeable top layer formed of a gas-permeable polydimethylsiloxane (PDMS) film. Some exemplary 3D frameworks do not have a top layer. The 3D framework also has a unique engineered nucleation site and remaining surfaces are coated to inhibit crystal nucleation.

The step of flowing the liquid starting material into the 3D framework 46 involves placing the entire 3D framework in an aqueous solution of calcium chloride ($CaCl_2$) so that the solution fills the 3D framework. An exemplary aqueous solution is 1 Molar $CaCl_2$ and has a pH of about 7–9. After filling, the 3D framework 46 is positioned so that any gas-permeable PDMS top layer is submerged in the solution.

The step of causing a crystal to grow involves exposing the aqueous solution to ammonium carbonate vapor at atmospheric pressure. The ammonium carbonate diffuses into the 3D framework through the gas-permeable PDMS top layer. After diffusing through the PDMS for about 10 minutes, the vapor produces a amorphous phase calcium carbonate (APCC) in the aqueous solution inside the 3D framework.

Exemplary aqueous starting solutions also include proteins, $Mg^{2+}$ions, and/or $PO_4^{3-}$ ions to stabilize the metastable APCC phase. Exemplary APCC phases are made from starting solutions including 1 Molar (M) $CaCl_2$, 0.1 M to 1.0 M $Mg^{2+}$, 0.01 M to 0.1M $PO_4^{3-}$, and stabilizing proteins. Stabilizing proteins may be extracted from body spicules of the solitary ascidian Pyura pachydermatina (Urochordata, Ascidiacea). The extraction involves dissolving the amorphous $CaCO_3$ spicules in a stoichiometric amount of HCl and then, dialyzing the produced solution. The extracted proteins aid to stabilize the metastable APCC phase when added in concentrations of about 1–4 micro-grams per milliliter. The extraction of such proteins is described in an article "Factors Involved in the Formation of Amorphous and Crystalline Calcium Carbonate", by Joanna Aizenberg et al, Journal of the American Chemical Society, vol. 124, no. 1 (2002) pages 32–39, which is incorporated herein by reference in its entirety.

The byproduct collection structures 44 of the 3D framework 46 also function to stabilize the APCC phase by releasing tensile stress in the APCC phase.

At room temperature, nucleation of a calcite crystal occurs at the engineered nucleation site after about 30 to 40 minutes. In the 3D framework 46 of FIG. 8, the calcite crystal grows to a linear dimensions of about 1 mm in about 100 to 200 minutes. This growth time is shorter than the time typically required for the APCC to spontaneously nucleate at other random points in the 3D framework 46. Thus, a single crystal rather than a polycrystalline film grows through the 3D framework 46.

In the above-method, the step of fabricating the 3D framework includes substeps of making the array of post-like structures 44, forming an engineered site to nucleate crystallization, treating remaining surfaces of the 3D framework to suppress nucleation, and assembling the 3D framework.

The substep of making the regularly ordered collection of structures 44 involves depositing a layer of photoresist on a PDMS film, and then lithographic patterning the photoresist to produce such structures 44. A wash with a solvent removes either the exposed or the unexposed regions of the photoresist to form the structures 44.

The substep of forming the engineered site to nucleate crystallization involves depositing a metallic base layer on a planar glass substrate, forming the nucleation site on the base layer, and treating the remainder of the base layer's surface to impede nucleation thereon. Depositing the base layer involves performing a conventionally deposition of about 5 nanometers (nm) of gold or silver on a surface of the glass substrate. Forming the nucleation site involves placing a self-assembling monolayer (SAM) of molecules on a disk-shaped area of the metallic base layer. The SAM includes molecules with the structure $HS(CH_2)D$ where the group "D" is OH, $CO_2H$, or $SO_3H$. A tip of an atomic force microscope places the molecules on the disk-shaped area. The orientation of functional groups in the SAM determines the crystal-orientation during subsequent crystal growth.

Figure 10:
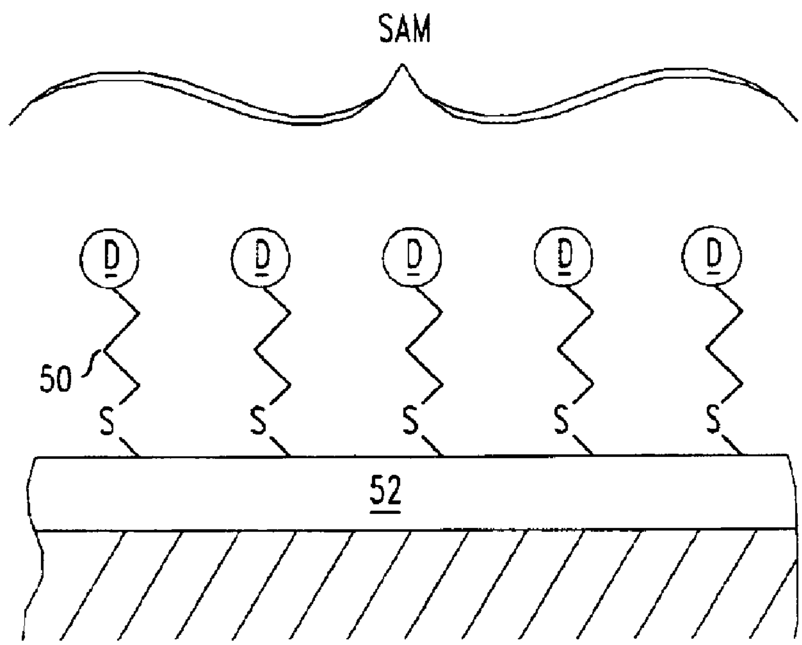
FIG. 10 is a cross-sectional view of an engineered site for nucleating crystal growth.

FIG. 10 shows the surface profile of the engineered nucleation site. The molecules 50 have stabilizing S-bonds with the underlying metallic base layer 52. The SAM's surface has a uniform height, because the molecules 50 of the SAM are identical and regularly ordered therein. The uniform surface profile stimulates crystal nucleation at the SAM. Nevertheless, different molecular orders in the SAM will cause a calcite crystal to grow with different crystalline orientations.

Figure 11:
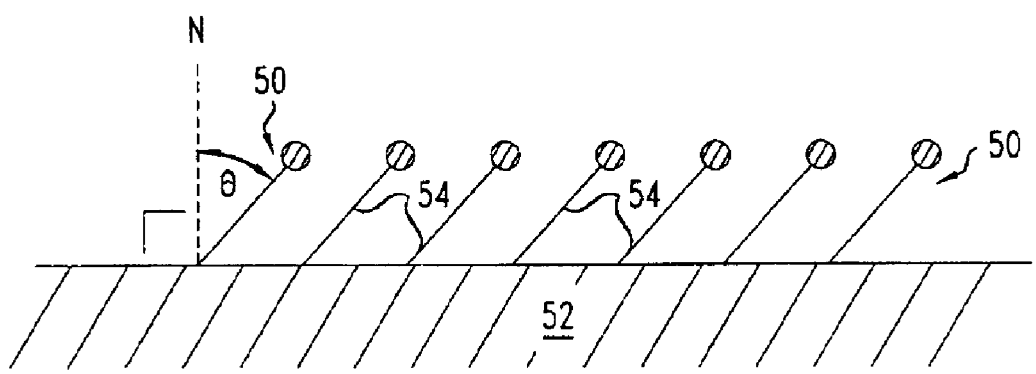
FIG. 11 is a cross-sectional view of molecular alignments in a SAM site that is engineered for nucleating crystal growth.
Figure 12:
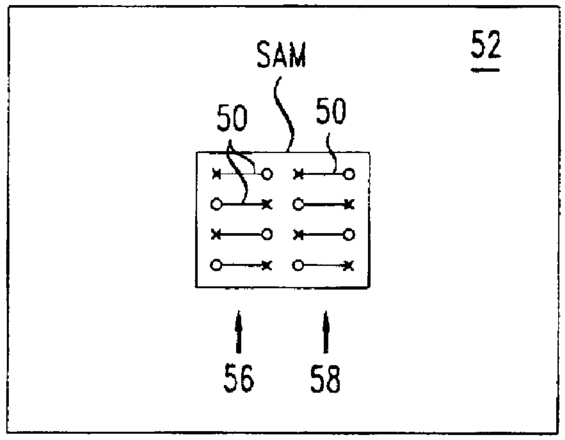
FIG. 12 is a top view of molecular alignments in an alternate SAM site that is engineered for nucleating crystal growth.

The SAMs of exemplary engineered nucleation sites are shown in FIGS. 11 and 12. In FIG. 11, the organic molecules 50 of the SAM have substantially parallel molecular axes 54. The molecular axes 54 are preferably tilted from the surface normal "N" by about 30 degrees and about 12 degrees for a base layer of gold and silver, respectfully. In FIG. 12, the organic molecules 50 of the SAM are arranged in straight rows 56, 58. In a single row 56, 58, laterally adjacent molecules 50 have reversed orientations so that the bound end of one molecule 50 is laterally adjacent to the free end of the next molecule 50 in the same row 56, 58. The SAMs of FIGS. 11 and 12 nucleate calcite crystals with different crystalline orientations.

Figure 13:
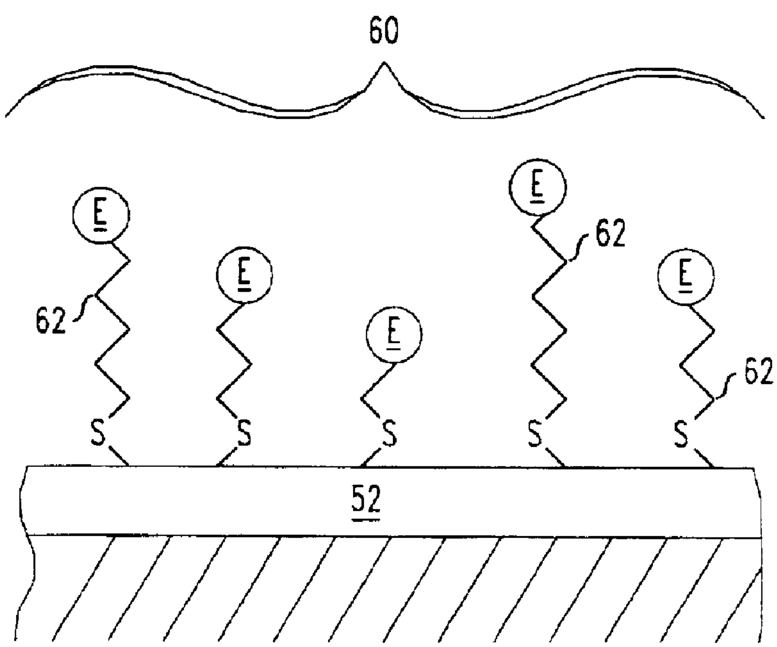
FIG. 13 is a cross-sectional view of a disordered layer that inhibits crystal nucleation away from an engineered nucleation site.

The substep of treating the remaining surfaces to suppress nucleation involves functionalizing the remainder of the base layer 52 with a disordered monolayer 60 of molecules 62 as shown in FIG. 13. The molecules 62 have alkane chains, a sulfur atom at the bond end, and a terminal group "E". In the molecules 62, the groups E are —OH, a —$CH_3$, or a —$PO_3H$ groups. The monolayer 60 is disordered due both to random variations in molecular chain lengths and random variations in the terminal groups E. An exemplary monolayer 60 includes a mixture of the three terminal E groups in equal parts. The disordered nature of the monolayer 60 inhibits nucleation away from the preformed engineered nucleation site.

The substep of assembling the 3D framework 46 includes positioning the PDMS film so that the post-like structures 44 make contact with the functionalized surface of the glass substrate 50. The assembled 3D framework is an enclosed volume. The post-like structures 44 cross the entire thickness of the enclosed volume. One surface of the volume includes the engineered nucleation site, and the other surface is a gas-permeable PDMS layer.

The above-described method enables fabrication of birefringent optical devices due to the birefringence of calcite crystals.

Figure 14:
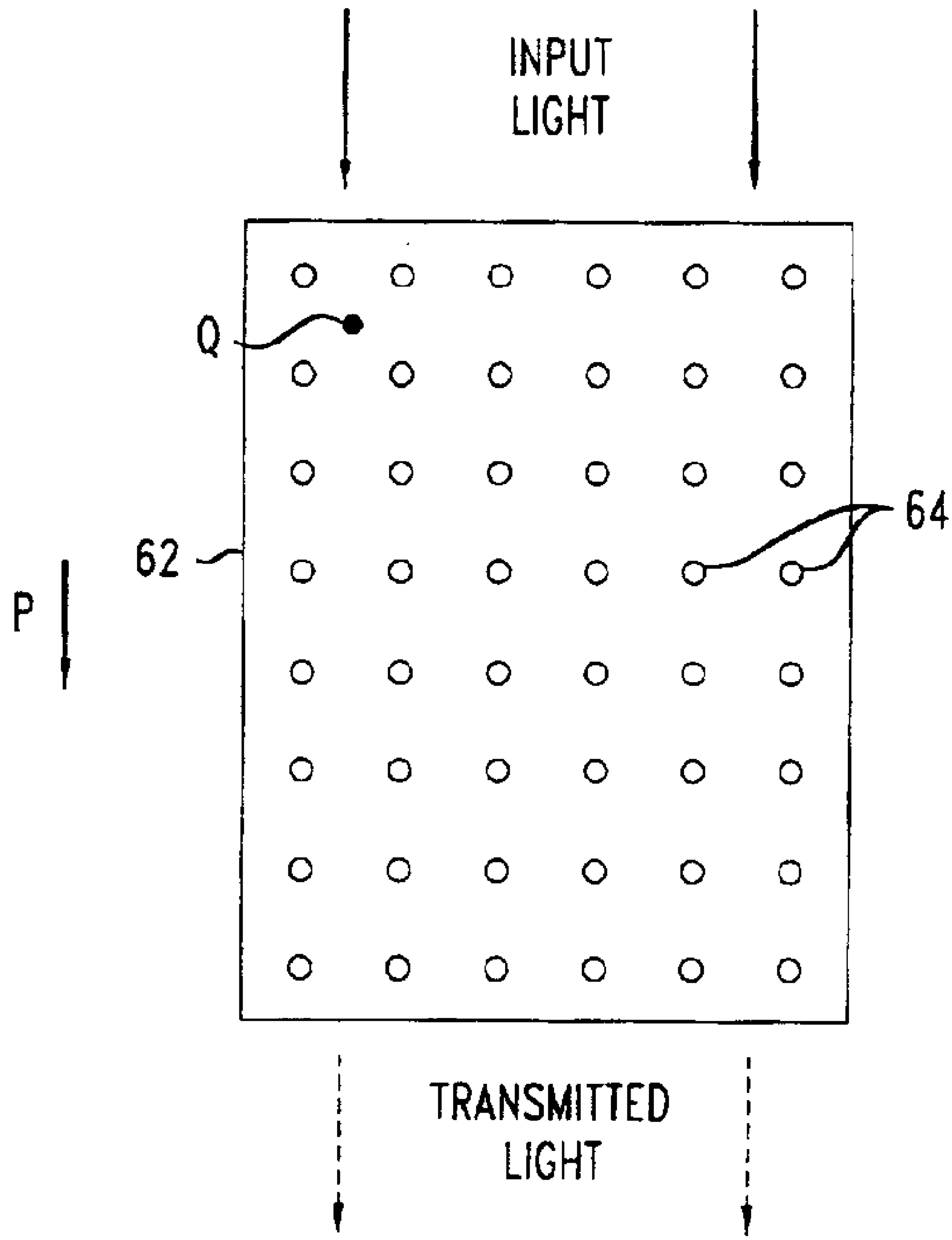
FIG. 14 shows a polarization-sensitive optical grating that was made according to the method of FIG. 3.

FIG. 14 shows a birefringent optical grating that includes a planar calcite crystal 62 made by the above-described method. The calcite crystal 62 includes a pattern of holes 64 having a 1D lattice periodicity along propagation direction P. The crystal 62 has an optical axis "Q" that is perpendicular to both the plane of the crystal 62 and the propagation direction P of light therein. Due to the orientation of the optical axis Q, extraordinary and ordinary polarized light have different refractive indexes along the propagation direction P. Along the direction P, the period of the holes 64 is selected to be an odd integer multiple of ¼ times a preselected wavelength of a preselected polarization. Due to the different refractive indexes of the two polarizations, the crystal 62 preferentially reflects input light of the preselected polarization and wavelength and does not reflect light with a polarization orthogonal to the preselected polarization at the same wavelength.

From the disclosure, drawings, and claims, other embodiments of the invention will be apparent to those skilled in the art.

What is claimed is:

1. A method for growing a crystal, comprising:

providing a 3D framework having a collection of solid structures;

flowing a liquid starting material around and between individual ones of the solid structures of the 3D framework; and growing a single crystal through the collection of solid structures by adjusting a property of the liquid starting material; and wherein the liquid starting material has a different chemical composition than the crystal.

2. The method of claim 1, wherein the growing comprises a transition from an amorphous phase of a material to a crystalline phase of the material.

3. The method of claim 1, wherein the growing is responsive to diffusing a gaseous material into the liquid starting material.

4. The method of claim 1, wherein the 3D framework comprises an engineered nucleation site, and the growing causes the crystal to nucleate at the engineered nucleation site.

5. The method of claim 1, wherein the 3D framework further comprises a coating on a portion of the 3D framework, the coating inhibiting nucleation of a crystal on the coated portion of the 3D framework.

6. The method of claim 1, wherein the collection of solid structures forms a pattern with a regular lattice symmetry.

7. The method of claim 1, wherein the lattice symmetry is a two-dimensional symmetry.

8. The method of claim 1, wherein the growing causes a byproduct material of the growth to collect adjacent to the solid structures, the byproduct material having a composition that is different from compositions of both the crystal and the liquid starting material.

9. The method of claim 1, wherein the growing produces a single crystal with a linear dimension of at least 100 microns.

10. An apparatus, comprising:

a layer formed of a single crystal, the layer having a collection of holes in the layer; and wherein the collection of holes forms a pattern having a regular lattice symmetry and the crystal comprises an organic material or a zeolite.

11. The apparatus of claim 10, wherein the holes are substantially identical; and wherein the layer forms an optical grating.

12. The apparatus of claim 10, wherein the layer forms a photonic bandgap structure.

13. The apparatus of claim 11, wherein the layer is a birefringent crystal.

14. The apparatus of claim 10, wherein the pattern of holes has a 2-dimensional lattice symmetry.

15. The apparatus of claim 10, further comprising:

a collection of solid structures, each structure being located in one of the holes and having a different composition than the layer.

16. The apparatus of claim 15, wherein the collection has a 2-dimensional lattice symmetry.

17. The apparatus of claim 10, wherein adjacent ones of the holes have separations of less than about 20 microns.

18. The apparatus of claim 10, wherein the holes pierce through the layer.

19. The apparatus of claim 10, wherein the holes of the collection are substantially identical.

20. The apparatus of claim 19, wherein the pattern of holes has a 2-dimensional lattice symmetry.

* * * * *